PHASE-LOCKED-LOOP COHERENT FM DETECTOR WITH SYNCHRONIZED REFERENCE OSCILLATOR

Filed March 29, 1962

INVENTORS
THOMAS E. BELING
ABBOTT W. LAHTI
BY
Morse & Altman
ATTORNEYS

United States Patent Office 3,189,825
Patented June 15, 1965

3,189,825

PHASE-LOCKED-LOOP COHERENT FM DETECTOR WITH SYNCHRONIZED REFERENCE OSCILLATOR

Abbott W. Lahti, 56 Aberdeen Ave., Cambridge, Mass., and Thomas E. Beling, 9 Tortuli Circle, Saxonville, Mass.

Filed Mar. 29, 1962, Ser. No. 183,557
11 Claims. (Cl. 325—346)

Figure 1:
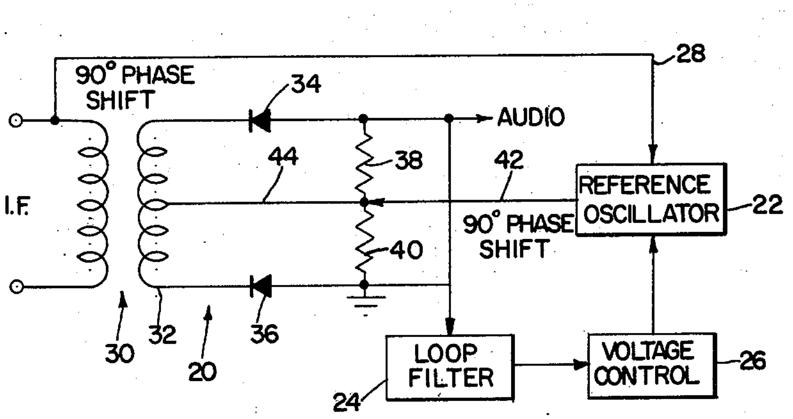

This invention relates in general to detecting systems for receivers of frequency modulated signals and in one aspect contemplates improvements in the synchronization of electronic oscillators. More particularly this invention concerns a new and improved FM discriminator in which an IF signal is employed to frequency modulate a reference oscillator for the discriminator in proper phase relation and according to the deviations of the incoming IF signal.

Heretofore, FM signals have been converted to audio signals by a number of different demodulators such as the Foster-Seeley discriminator working in conjunction with a limiter, or by means of a ratio detector which operates without the need of a separate limiting stage. Gated beam detectors have also been widely used as have locked in oscillator detectors. All of these demodulators, while possessing certain advantages one over the other, at the same time suffer some rather serious disadvantages. For example, the Foster-Seeley limiter discriminator is relatively easy to balance but weak input signals are subject to AM interference. In a ratio detector, on the other hand, weak signals are substantially free from AM interference while distortion and noise increase with detector unbalance and decreasing IF bandwidth.

More recent developments in the conversion of FM to AM include the phase locked loop discriminator which employs a voltage controlled reference oscillator in a feedback arrangement for the purpose of multiplying the incoming signal and functions as a linear frequency detector. This type of detector has self-limiting characteristics but, as compared with conventional discriminators, operates over a reduced range of frequency deviation.

Basically the reason for the narrow range of operation is due to oscillator synchronization characteristics. While the phase locked loop achieves oscillator synchronization with a small phase error and maintains this locked condition even under a poor signal-to-noise ratio, the difference between the synchronizing signal and the oscillator free running frequency must be small before locking occurs. Synchronization of the oscillator might also be obtained by directly connecting the synchronizing source to the oscillator signal. However, with this arrangement, the phase error may be high and control is not automatic. Also the oscillator will not synchronize particularly well under poor signal-to-noise conditions.

Accordingly, it is a general object of the present invention to provide for improvements in FM detecting systems.

Another object of this invention is to provide a stable FM discriminator capable of efficient tracking over a wide range of frequency deviations.

Still another object of this invention is to provide an FM discriminator having self-limiting characteristics, a high output and operational flexibility.

Yet another object of this invention is to provide an active FM detector having a low detection threshold.

A further object of this invention is to provide means for improving the synchronization of electronic oscillating systems.

More particularly, this invention features an oscillator synchronization system in which a synchronizing signal is a direct input to a feedback controlled oscillator. As embodied in an FM detecting system a zero degrees phase shift reference coupling is applied from the frequency modulated IF signal to a reference oscillator for the discriminator with the result that the oscillator has an acquisition range that is increased over that of the phase locked loop oscillator while functioning with an essentially low phase error between the oscillator and synchronizing signal.

Figure 2:
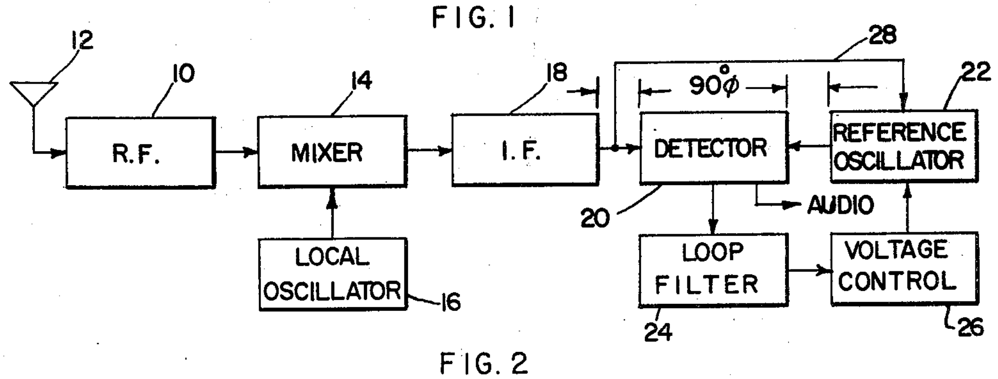
Figure 3:
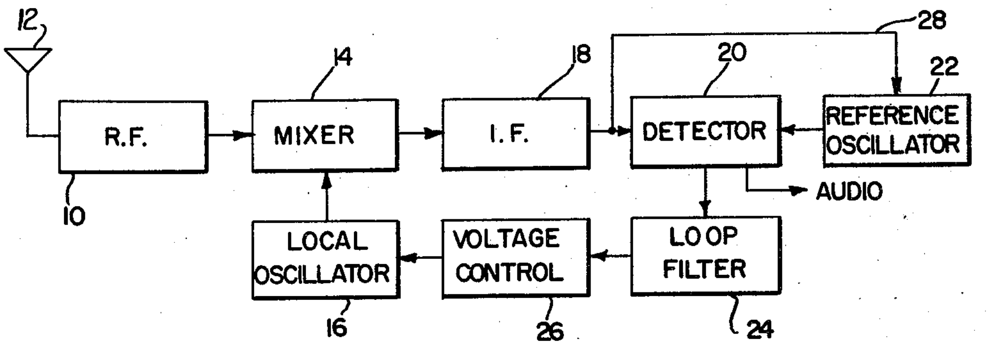

But these and other features of the invention, along with further objects and advantages thereof, will become more fully apparent from the following detailed description with reference being made to the accompanying drawings in which:

FIG. 1 is a schematic diagram of an FM detector system made according to the invention, FIG. 2 is a block diagram of a complete FM tuning system employing the detector of FIG. 1, and, FIG. 3 is a block diagram of a modification of the tuning system of FIG. 2.

Referring now to the drawings and to FIG. 2 in particular, there is illustrated a diagram of an improved oscillator synchronizing system as embodied in an FM tuner. In the drawings, the reference character 10 generally indicates a radio frequency amplifier connected to an antenna 12 and adapted to feed an amplified RF signal to a converter stage comprising a mixer 14 and a local oscillator 16. The IF signal coming from the mixer 14 is amplified by an IF amplifier 18 and is fed through a demodulating stage.

The demodulating portion of the tuner is generally organized about a detector or discriminator 20 which receives the output of a reference oscillator 22. The reference oscillator is seen to constitute part of a feedback system for the detector 20 and includes a loop filter 24 and a voltage controller 26.

As thus far described, the demodulating stage conforms to a phase locked loop discriminator and operates basically like a voltage controlled oscillator multiplying an incoming signal and the output of which is filtered and then used to control the voltage controlled reference oscillator. It will be understood that the effect of the feedback loop is to cause the error voltage to go to zero phase. This takes place when the reference oscillator has the same frequency and a 90° phase shift to the incoming signal.

According to the present invention, it has been found that a markedly superior demodulating stage may be obtained by a 0° phase shift reference coupling 28 directly between the IF amplifier stage 18 and the reference oscillator 22. The reference coupling partially or completely frequency modulates the reference oscillator 22 in the correct phase relationship. Under conditions whereby the reference oscillator 22 is frequency modulated to the same deviation as the IF signal then the discriminator 20, reference oscillator 22 and reference coupling 28 function as a pure active detector and the feedback loop will not be required for operation. However, if the reference coupling is reduced to zero, the system functions as a phase locked loop discriminator.

It will be understood that if the reference oscillator is frequency modulated to a fractional deviation of the incoming signal then the feedback loop will be the primary control and the loop filter and voltage controller will be operational. Any change in the strength of the IF signal will automatically vary the reference coupling so that at low signal levels operation approaches that of a phase locked loop and a low detection threshold occurs. At high signal levels the reference coupling predominates and the system demodulates in a square law manner.

In FIG. 1 there is shown a circuit diagram of the demodulating stage with standard components indicated in block form. An amplified IF signal is passed through the primary coil of a transformer 30 and induces a current in a divided secondary coil 32. As the frequency modulated IF signal rises the coil passes an induced current through one diode 34 for rectification and as the IF signal falls a current is passed through another diode 36. The rectified currents pass in opposite directions through a pair of resistors 38 and 40 and the required alternating voltage is provided for the audio output. Connection is made with the reference oscillator by means of a lead 42 which connects at the junction of the resistors 38 and 40 and a center tap 44 for the secondary coil 32. The loop filter is connected directly to the audio output lead and the reference coupling 28 connects the reference oscillator to the primary side of the transformer 30, as shown.

The above described circuit offers a number of important advantages among which are included improved detection of noisy weak signals and a low phase error between the oscillator and synchronizing signal. At low signal levels operation of the circuit approaches that of a phase locked loop discriminator and displays a low detection threshold. In other words, the detector functions linearly in contrast to most detectors which are square law in operation.

The detector is selective and off-channel rejection is high with the result that IF selectivity requirements are reduced and tuning of the receiver is simplified. Because of the large, clean signal locally generated by the reference oscillator and because of the loop feedback, distortion is of a very low order. In addition, side tuning responses are substantially non-existent, capture ratio is high and inherent and the demodulated output signal is high with a corresponding reduction in audio gain requirements. Furthermore, by selecting the circuit values of certain components, the demodulator may be adjusted to have any mode of operation between that of a phase locked loop discriminator and an active detector which functions without the loop.

Also, the circuit has self-limiting characteristics with the result that the demodulated signal maintains a constant level and is essentially independent of the level of the IF signal. As an added advantage, the loop may be adjusted to provide large amounts of A.C. feedback without developing regenerative instabilities peculiar to the phase locked loop discriminator or square law FM detectors with A.C. feedback.

In the case of a square law discriminator having an A.C. feedback arrangement, the circuit may be adjusted to have the low noise properties of a phase locked loop discriminator of the same bandwidth and function as a tracking detector. The detector of the present invention can accommodate A.C. feedback for a low detection threshold even when adjusted to function almost as a square law detector without the usual instabilities of such detectors.

In FIG. 3 there is illustrated a modification of the invention and, in this embodiment, additional loop gain is obtained by employing the superheterodyne local oscillator 16 as the voltage controlled oscillator. As before, the reference coupling 28 connects the IF signal to the reference oscillator 22. With this arrangement distortions arising from the IF amplifier are reduced because of the loop feedback, loop gain is increased with frequency conversion and automatic frequency control of the local oscillator is inherent.

While the invention has been described with particular reference to the illustrated embodiments, it will be understood that numerous modifications thereof will appear to those skilled in the art without departing from the spirit of the invention. For example, the invention may be used to advantage in synchronizing a subcarrier oscillator for an FM transmitter multiplexing system or the horizontal oscillator in a TV receiver. It will also be understood that the above description has been made as illustrative of the invention and should not be taken in a limiting sense.

We claim:

1. A coherent demodulating system for producing an output signal the amplitude of which is modulated according to modulations in the frequency of an incoming signal, comprising a phase-locked-loop frequency modulation detector adapted to produce said output signal, means for applying said incoming signal to said detector, means for generating an alternating reference signal as a separate input to said detector and means for applying a zero degrees phase shift reference coupling directly from said incoming signal to said generating means for modulating the frequency of said generating means according to the same deviations as said incoming signal.

2. A coherent demodulating system for producing an output signal the amplitude of which is modulated according to modulations in the frequency of an incoming signal, comprising a phase-locked-loop frequency modulation detector adapted to produce said output signal, means for applying said incoming signal to said detector, means for generating an alternating reference signal as a separate input to said detector, separate means for applying a zero degrees phase shift reference coupling directly from said incoming signal to said generating means for modulating the frequency of said generating means according to the same deviations as said incoming signal and feedback means from said detector to said generating means for controlling the voltage of said generating means.

3. A coherent demodulating system for producing an output signal the amplitude of which is modulated according to modulations in the frequency of an incoming signal, comprising incoming signal receiving means including a mixer stage and a local oscillator, a phase-locked-loop frequency modulation detector adapted to produce said output signal, means for applying said incoming signal to said detector, means for generating an alternating reference signal as a separate input to said detector, separate means for applying a zero degrees phase shift reference coupling from said incoming signal directly to said generating means for modulating the frequency of said generating means according to the same deviations as said incoming signal and feedback means from said detector to said local oscillator for controlling the frequency of said local oscillator.

4. A coherent demodulating system, comprising means for receiving a frequency modulated signal at a radio frequency, means for converting said signal to an intermediate frequency, a phase-locked-loop frequency modulation detector for producing an output signal the amplitude of which is modulated according to modulations in the frequency of an incoming signal, means for applying said signal to said detector, means for generating an alternating reference signal as a separate input to said detector and means for applying a zero degrees phase shift reference coupling from said incoming signal directly to said generating means for modulating the frequency of said generating means according to the same deviations as said incoming signal.

5. A coherent demodulating system, comprising receiving means for reception of frequency modulted RF signals, mixing means including a local oscillator for converting said signals to an IF frequency, a phase-locked-loop frequency modulation detector for producing output signals the amplitude of which are modulated according to modulations in the frequency of incoming signals, means for applying said signals to said detector, means for generating an alternating reference signal as a separate input to said detector and means for applying a zero degrees phase shift reference coupling from said incoming IF signal directly to said generating means for modulating the frequency of said generating means according to the same deviations as said incoming IF signal.

6. A coherent demodulating system, comprising receiving means for reception of frequency modulated RF signals, mixing means including an oscillator for converting said RF signals to an IF frequency, a phase-locked-loop frequency modulation detector for producing output signals the amplitude of which are modulated according to modulations in the frequency of incoming signals, means for applying said IF signals to said detector, means for generating an alternating reference signal as a separate input to said detector and means for applying a reference coupling from said incoming IF signal directly to said generating means for modulating the frequency of said generating means according to the same deviations as said incoming IF signal.

7. A coherent demodulating system, comprising receiving means for reception of frequency modulated RF signals, mixing means including an oscillator for converting said signals to an IF frequency, a phase-locked-loop frequency modulation detector for producing output signals the amplitude of which are modulated according to modulations in the frequency of incoming signals, means for applying said signals to said detector, means for generating an alternating reference signal as a separate input to said detector, means for applying a reference coupling from said incoming IF signal directly to said generating means for modulating the frequency of said generating means according to the same deviations as said incoming IF signal and feedback means from said detector to said generating means for controlling the voltage of said generating means.

8. A coherent demodulating system, comprising receiving means for reception of frequency modulated RF signals, mixing means including a local oscillator for converting said signals to an IF frequency, a phase-locked-loop frequency modulation detector for producing output signals the amplitude of which are modulated according to modulations in the frequency of incoming signals, means for applying said signals to said detector, means for generating an alternating reference signal as a separate input to said detector, means for applying a reference coupling from said incoming IF signal directly to said generating means for modulating the frequency of said generating means according to the same deviations as said incoming IF signal and feedback means from said detector to said oscillator for reducing distortion of said incoming signal and controlling the frequency of said oscillator.

9. A coherent demodulating system, comprising receiving means for reception of frequency modulated RF signals, mixing means including a local oscillator for converting said RF signals to an IF frequency, a phase-locked-loop frequency modulation detector for producing output signals the amplitudes of which are modulated according to modulations in the frequency of incoming signals, transformer means for applying said signals to said detector, a reference oscillator for generating an alternating signal as a separate input to said detector and means for applying a reference coupling from said incoming IF signal directly to said reference oscillator for modulating the frequency of said reference oscillator according to the same deviations as said incoming IF signal.

10. A coherent demodulating system, comprising receiving means for reception of frequency modulated RF signals, mixing means including a local oscillator for converting said RF signals to an IF frequency, a phase-locked-loop frequency modulation detector for producing output signals the amplitudes of which are modulated according to modulations in the frequency of incoming signals, transformer means for applying said signals to said detector, a reference oscillator for generating an alternating signal as a separate input to said detector, means for applying a reference coupling from said incoming IF signal directly to said reference oscillator for modulating the frequency of said reference oscillator according to the same deviations as said incoming IF signal and means including a filter and a voltage controller connected to said detector and reference oscillator for controlling the voltage of said reference oscillator.

11. A control system for synchronizing an oscillator with an alternating signal of varying frequency, comprising an oscillator adapted to generate an output signal, a device responsive to variations in the frequency of said alternating signal, said alternating signal constituting one input to said device and said oscillator output signal constituting another input to said device, feedback means connecting said device to said oscillator and connecting means for directly coupling said alternating signal to said oscillator.

References Cited by the Examiner

UNITED STATES PATENTS

| | | | |
|---|---|---|---|
| 2,296,056 | 9/42 | Roberts | 329—123 |
| 2,410,982 | 11/46 | Koch | 329—123 XR |
| 2,677,049 | 4/54 | Rogers | 325—346 XR |
| 2,977,409 | 3/61 | Farr | 325—423 XR |

DAVID G. REDINBAUGH, *Primary Examiner.*